United States Patent
Taga et al.

(10) Patent No.: US 10,557,190 B2
(45) Date of Patent: Feb. 11, 2020

(54) SUBSTRATE PROCESSING APPARATUS AND SUSCEPTOR

(71) Applicant: Tokyo Electron Limited, Tokyo (JP)

(72) Inventors: Satoshi Taga, Miyagi (JP); Yoshiyuki Kobayashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 995 days.

(21) Appl. No.: 14/163,115

(22) Filed: Jan. 24, 2014

(65) Prior Publication Data
US 2014/0202386 A1    Jul. 24, 2014

Related U.S. Application Data

(60) Provisional application No. 61/758,471, filed on Jan. 30, 2013, provisional application No. 61/783,597, filed on Mar. 14, 2013.

(30) Foreign Application Priority Data

Jan. 24, 2013  (JP) .................................. 2013-010855
Mar. 11, 2013  (JP) .................................. 2013-048172

(51) Int. Cl.
| H01L 21/683 | (2006.01) |
| C23C 4/08 | (2016.01) |
| C23C 16/458 | (2006.01) |
| H01L 21/687 | (2006.01) |

(52) U.S. Cl.
CPC ............ C23C 4/08 (2013.01); *C23C 16/4581* (2013.01); *H01L 21/683* (2013.01); *H01L 21/687* (2013.01)

(58) Field of Classification Search
CPC ........ C23C 4/127; C23C 4/08; C23C 16/4581
See application file for complete search history.

(56) References Cited

U.S. PATENT DOCUMENTS

5,530,616 A * 6/1996 Kitabayashi ........ H01L 21/6831
                                                    361/234
6,475,336 B1 * 11/2002 Hubacek ............. C23C 16/4585
                                                    118/723 E
(Continued)

FOREIGN PATENT DOCUMENTS

CN          101842877          9/2010
JP          03003249 A   *     1/1991
(Continued)

*Primary Examiner* — Yuechuan Yu
(74) *Attorney, Agent, or Firm* — IPUSA, PLLC

(57) ABSTRACT

A substrate processing apparatus includes a chamber, a susceptor to receive a substrate and provided in the chamber, a gas supply source to supply a predetermined gas into the chamber, and a high frequency power source to treat the substrate by plasma. The susceptor includes a first ceramics base member including a flow passage to let a coolant pass through, a first conductive layer formed on a principal surface and a side surface on a substrate receiving side of the first ceramics base member, and an electrostatic chuck stacked on the first conductive layer and configured to electrostatically attract the wafer received thereon. A volume of the flow passage is equal to or more than a volume of the first ceramics base member. The high frequency power source is configured to supply high frequency power to the first conductive layer.

19 Claims, 16 Drawing Sheets

(56) References Cited

U.S. PATENT DOCUMENTS

| | | | |
|---|---|---|---|
| 2002/0036881 A1* | 3/2002 | Shamouilian | C04B 35/185 361/234 |
| 2003/0029572 A1* | 2/2003 | Kanno | H01L 21/67109 156/345.53 |
| 2003/0168439 A1* | 9/2003 | Kanno | H01L 21/67109 219/390 |
| 2004/0065259 A1* | 4/2004 | Inazumachi | H01J 37/32724 118/724 |
| 2004/0173314 A1* | 9/2004 | Nishio | C23C 16/4404 156/345.33 |
| 2004/0187787 A1* | 9/2004 | Dawson | C23C 16/4586 118/728 |
| 2005/0257747 A1* | 11/2005 | Wakabayashi | C23C 16/4581 118/728 |
| 2006/0144516 A1* | 7/2006 | Ricci | H01L 21/67103 156/345.27 |
| 2008/0314523 A1 | 12/2008 | Iizuka | |
| 2009/0111276 A1 | 4/2009 | Dhindsa et al. | |
| 2010/0067165 A1 | 3/2010 | Ando et al. | |
| 2010/0326957 A1* | 12/2010 | Maeda | H01J 37/20 216/67 |
| 2011/0287631 A1* | 11/2011 | Yamamoto | H01J 37/32568 438/710 |

FOREIGN PATENT DOCUMENTS

| | | |
|---|---|---|
| JP | 03194948 A * | 1/1991 |
| JP | 10308299 A * | 11/1998 |
| JP | H11-506873 | 6/1999 |
| JP | 2002-016045 | 1/2002 |
| JP | 2004342984 A * | 12/2004 |
| JP | 2005-057234 | 3/2005 |
| JP | 2008-270383 | 11/2008 |
| JP | 2010-282788 | 12/2010 |
| JP | 2011-142177 | 7/2011 |
| JP | 2012-186457 | 9/2012 |
| TW | 201028368 | 8/2010 |

* cited by examiner

FIG.4

|  | Al BASE MEMBER | SiC BASE MEMBER (RC: ROLL COMPACTION METHOD) |
|---|---|---|
| WEIGHT (g) | 5000 | 1200 |
| SPECIFIC HEAT (J/g·K) | 0.9 | 0.67 |
| SPECIFIC GRAVITY | 2.7 | 3.15 |
| k (W/m·K) | 170 | 190 |
| HEAT CAPACITY (J/K) | 4500 | 800 |

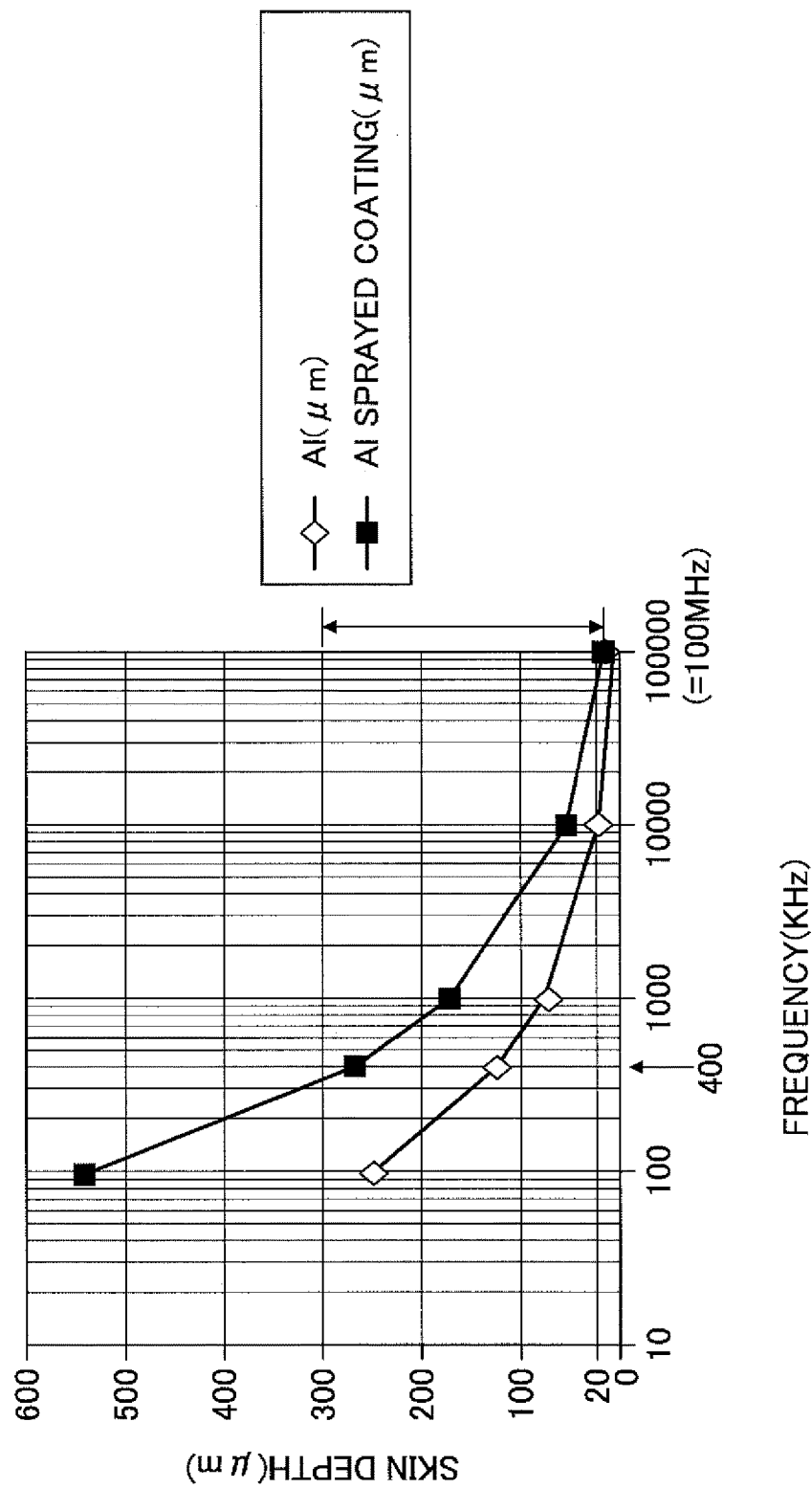

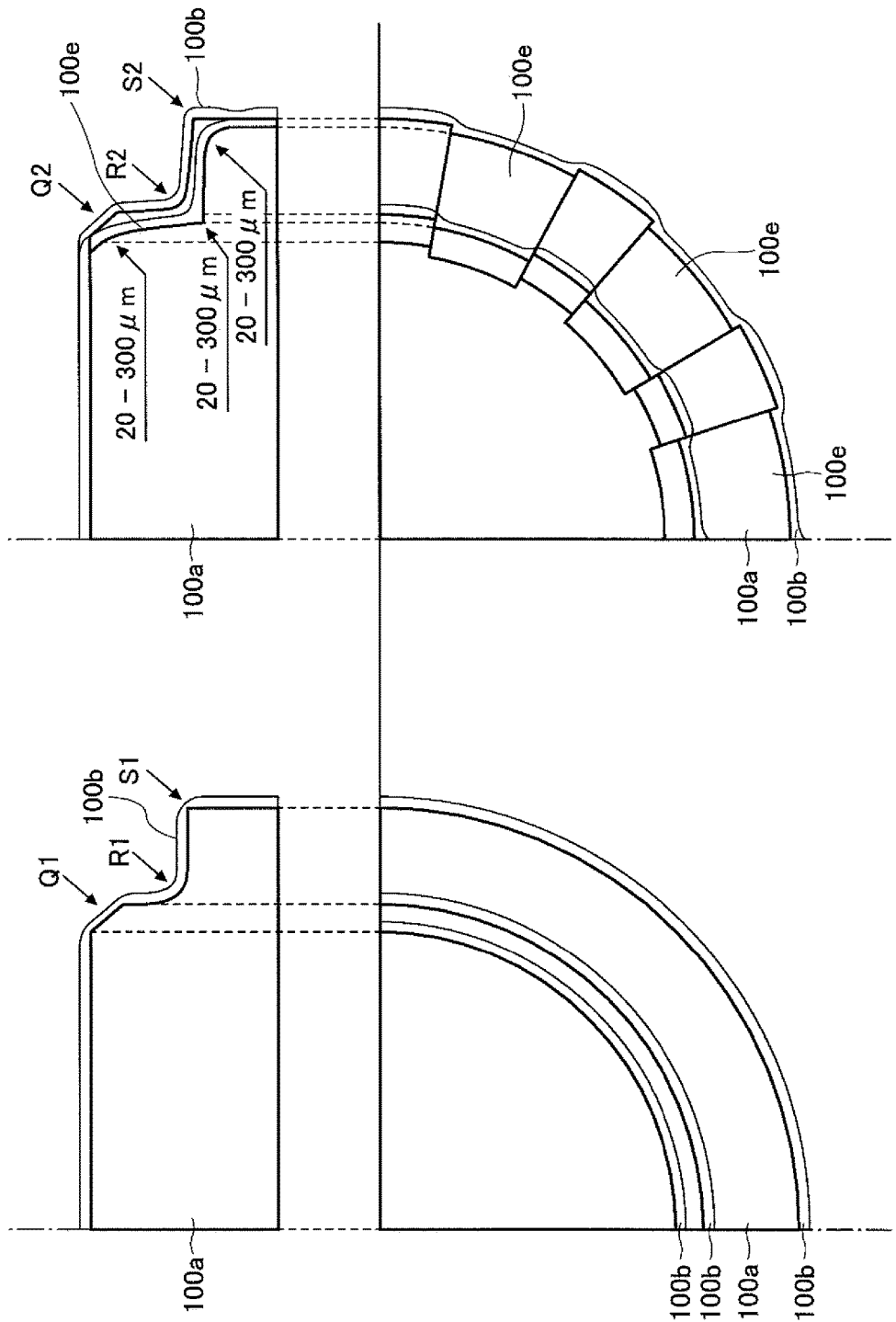

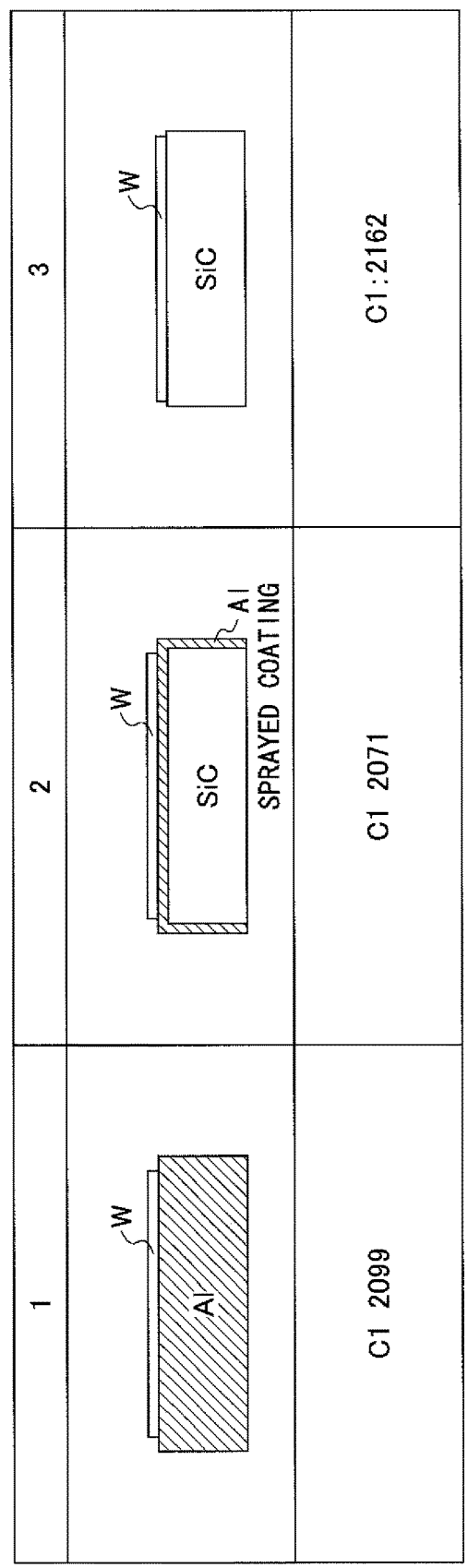

SUBSTRATE PROCESSING APPARATUS AND SUSCEPTOR

CROSS-REFERENCE TO RELATED APPLICATIONS

This patent application is based upon and claims the benefit of priority of Japanese Patent Application No. 2013-10855, filed on Jan. 24, 2013, U.S. Provisional Patent Application No. 61/758,471, filed on Jan. 30, 2013, Japanese Patent Application No. 2013-48172, filed on Mar. 11, 2013, and U.S. Provisional Patent Application No. 61/783,597, filed on Mar. 14, 2013, the entire contents of which are incorporated herein by reference.

BACKGROUND OF THE INVENTION

1. Field of the Invention

The present invention relates to a substrate processing apparatus and a susceptor.

2. Description of the Related Art

In order to perform an intended microfabrication in a substrate, controlling a temperature of the substrate to keep the substrate at an appropriate temperature is important. Accordingly, it has been practiced to control the temperature of the substrate on a susceptor to set the substrate at an intended temperature by adjusting a temperature of the susceptor by using a temperature controller such as chiller embedded in the susceptor (see, for example, Japanese Laid-Open Patent Application Publication No. 2005-57234).

The temperature of the substrate can be rapidly increased and decreased by shortening time required to actually bring the susceptor to the controlled temperature in response to the temperature control of the susceptor and by improving temperature responsiveness of the susceptor.

Major factors that enhance the temperature responsiveness of the susceptor include heat capacity. When a base member of the susceptor is made of aluminum or aluminum alloy, ensuring a mechanical strength of the susceptor is required by making the base member a predetermined thickness or more. As a result, the base member weighs a predetermined weight or more. When the weight of the base member is heavy, reducing the heat capacity of the susceptor is difficult.

SUMMARY OF THE INVENTION

Embodiments of the present invention provide a novel and useful film deposition apparatus and film deposition method solving one or more of the problems discussed above.

More specifically, in response to the above-mentioned problem, embodiments of the present invention provide a substrate processing apparatus and a susceptor capable of improving temperature responsiveness of a susceptor.

According to one embodiment of the present invention, there is provided a substrate processing apparatus that includes a chamber, a susceptor to receive a substrate and provided in the chamber, a gas supply source to supply a predetermined gas into the chamber, and a high frequency power source to treat the substrate by plasma. The susceptor includes a first ceramics base member including a flow passage to let a coolant pass through, a first conductive layer formed on a principal surface and a side surface on a substrate receiving side of the first ceramics base member, and an electrostatic chuck stacked on the first conductive layer and configured to electrostatically attract the wafer received thereon. A volume of the flow passage is equal to or more than a volume of the first ceramics base member. The high frequency power source is configured to supply high frequency power to the first conductive layer.

According to another embodiment of the present invention, there is provided a susceptor that includes a first ceramics base member including a flow passage to let a coolant pass through and formed therein, a first conductive layer formed on a principal surface and a side surface on a substrate receiving side of the first ceramics base member, and an electrostatic chuck stacked on the first conductive layer and configured to electrostatically attract a substrate placed thereon. A volume of the flow passage is equal to or more than a volume of the first ceramics base member.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 4 is a table comparing a physical property of a base member made of SiC according to an embodiment with that of a base member made of Al;

FIG. 12 is a graph comparing a skin depth of a sprayed film made of Al according to an embodiment with that of a base member made of Al and;

FIGS. 14A and 14B are views illustrating a sprayed film made of Al formed on a base member made of SiC according to an embodiment;

FIG. 15 is a view comparing relationships between a configuration of a susceptor and a matching point according to an embodiment.

DETAILED DESCRIPTION OF THE
PREFERRED EMBODIMENTS

A description is given below of an embodiment of the present invention, with reference to the drawings. In the present specification and the drawings, with respect to the substantially same configuration, overlapped descriptions are omitted by attaching the same numerals.

[Etching Processing Apparatus]

Figure 1:
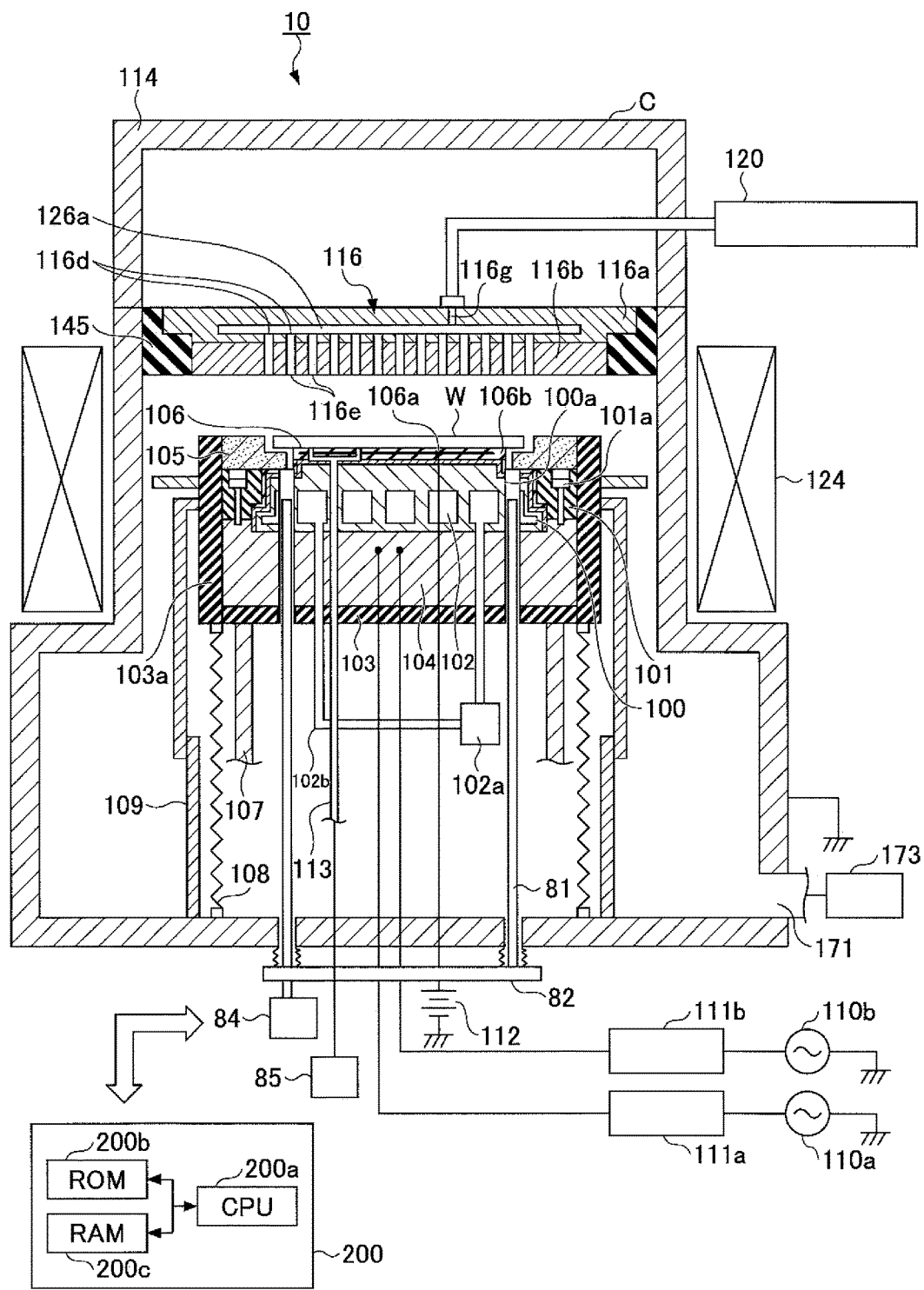
FIG. 1 is a vertical cross-sectional side view illustrating an etching processing apparatus according to an embodiment.

To begin with, a description is given below of an example of an etching processing apparatus of an embodiment of the present invention with reference to FIG. 1. FIG. 1 is a vertical cross-sectional view of a lower-part-two-frequency-application-type parallel plate etching processing apparatus in a parallel plate plasma apparatus.

An etching processing apparatus 10 keeps its inside sealed and includes a chamber C electrically grounded. The chamber C has a cylindrical shape, and for example, is made of aluminum whose surface is anodized. A susceptor 100 is provided that supports a silicon wafer W (which is hereinafter just called a "wafer W") inside the chamber C. A base member 100a of the susceptor 100 is made of silicon carbide (SiC). The susceptor 100 is supported by a support 104 through a clamp 101 by using a screw 101a. The support 104 is made of aluminum. The susceptor 100 also functions as a lower electrode. Here, the base member 100a of the susceptor 100 corresponds to a first ceramics base member.

The susceptor 100 can be moved up and down by an elevating mechanism 107 through an insulating plate 103. The elevating mechanism 107 is covered with a bellows 108 that connects the bottom of the chamber C with the insulating plate 103. The bellows 108 is made of stainless steel. A bellows cover 109 is provided outside the bellows 108.

A focus ring 105 is provided on an outer periphery of the susceptor 100. The focus ring 105 is made of silicon (Si). A cylindrically shaped inner wall member 103a, which is, for example, made of quartz, is provided on an outer circumference of the susceptor 100, the support 104 and the focus ring 105.

An electrostatic chuck 106 to electrostatically attract the wafer W is provided on an upper surface of the susceptor 100. The electrostatic chuck 106 has a structure having a chuck electrode 106a embedded in an insulating plate 106b. The insulating plate 106b is, for example, made of alumina ($Al_2O_3$). A direct voltage source 112 is connected to the chuck electrode 106b. When a direct voltage is applied to the chuck electrode 106a from the direct voltage source 112, the wafer W is attracted on the electrostatic chuck 106 by a coulomb force.

A flow passage 102 is formed inside the susceptor 100. The flow passage 102 is connected to a cooling mechanism 102a through pipes 102b. The cooling mechanism 102a serves to adjust the wafer W to a predetermined temperature by allowing a coolant such as propene, 1,1,2,3,3,3,-hexafluoro-, oxidized, polymd (Galden™) and cooling water to flow through the pipes 102b and by circulating the coolant in the flow passage 102. A heat transfer gas supply source 85 supplies a heat transfer gas such as a helium gas (He) and an argon gas (Ar) to a back surface of the wafer W on the electrostatic chuck 106 through a gas supply line 113.

Transfer of the wafer W is performed by moving pins 81 that support the wafer W up and down. The pins 81 are connected to a drive mechanism 84 through a coupling member 82. The pins 81 move up and down by a driving force of the drive mechanism 84, and support the wafer W by penetrating through-holes 100a provided in the susceptor 100.

A first high frequency power source 110a is connected to the susceptor 100 through a first matching box 111a. The first high frequency power source 110a, for example, supplies high frequency power of 40 MHz for plasma generation to the susceptor 100. Moreover, a second matching box is connected to the susceptor 100 through a second high frequency power source 110b. The second high frequency power source 110b, for example, supplies high frequency power for bias of 3.2 MHz to the susceptor 100.

A shower head 116 is provided facing the susceptor 100, above and between the susceptor 100 and a ceiling portion of the chamber C. The shower head 116 is supported by a side wall of the chamber C through an insulating member 145. By this structure, the shower head 116 that functions as the upper electrode and the susceptor 100 that functions as the lower electrode form a pair of electrode structure.

The shower head 116 includes a body part 116a and an upper ceiling plate 116b that forms an electrode plate. The body part 116a is made of a conductive material, for example, aluminum whose surface is anodized, and supports the upper ceiling plate 116b on its lower surface detachably.

A diffusion chamber 126a of gas is provided inside the body part 116a. The diffusion chamber 126a is communicated with many gas pipes 116d and introduces a gas into gas introduction holes 116e.

A gas introduction port 116g to introduce a gas into the diffusion chamber 126a is formed in the body part 116a. A gas supply source 120 is connected to the gas introduction port 116g. The gas supply source 120 supplies an etching gas during the process. The etching gas supplied from the gas supply source 120 to the diffusion chamber 126a is introduced to a plasma processing space in the chamber C in a form of a shower through the gas pipes 116d and the gas introduction holes 116e.

A lid body 114 of a cylindrical shape is provided so as to extend from the side wall of the chamber C to a position higher than a height position of the shower head 116. The lid body 114 is a conductor and grounded. An exhaust port 171 is formed in the bottom of the chamber C. An exhaust device 173 is connected to the exhaust port 171. The exhaust device 173 includes a vacuum pump not shown in the drawing, and reduces a pressure in the chamber C up to a predetermined degree of vacuum. A dipole ring magnet 124 that circularly or concentrically extends is arranged at an outer circumference of the chamber C.

By this configuration, an RF (Radio Frequency) electric field is formed in a vertical direction in a space between the susceptor 100 and the shower head 116 by a first high frequency power source 110a, and a horizontal magnetic field is formed by the dipole ring magnet 124. High-density plasma is generated in the vicinity of the surface of the susceptor 100 by a magnetron discharge using these orthogonal electric and magnetic fields.

A control device 200 controls each part attached to the etching processing apparatus 10 such as the gas supply source 120, the exhaust device 173, the high frequency power sources 110a, 110b, the matching boxes 111a, 111b, the direct voltage source 112, the drive mechanism 84, and the heat transfer gas supply source 85.

The control device 200 includes a CPU (Central Processing Unit) 200a, a ROM (Read Only Memory) 200b, and a RAM (Random Access Memory) 200c. The CPU 200a executes a plasma treatment in accordance with various recipes stored in the ROM 200b or the RAM 200c. The recipes contain apparatus control information in response to process conditions such as a process time, a temperature in the chamber (upper electrode temperature, side wall temperature of the chamber, ESC temperature and so on), a pressure (of gas exhaustion), high frequency power and voltage, various process gas flow rates, a heat transfer flow rate. As discussed above, a description was given of a whole configuration of the etching processing apparatus 10 of the present embodiment.

[Method of Manufacturing Susceptor]

Figure 2:
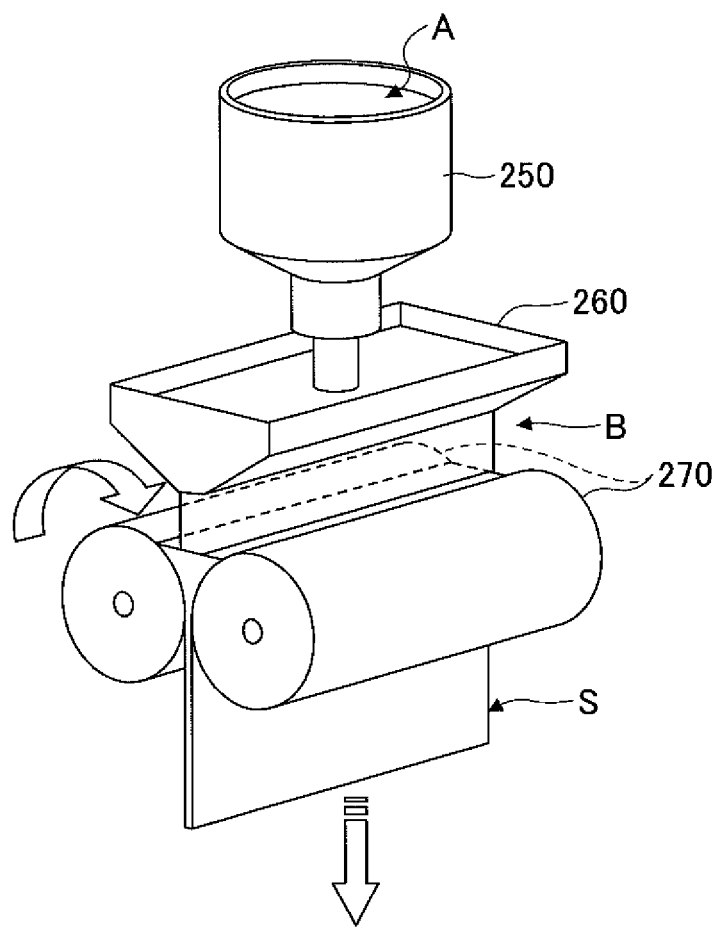
FIG. 2 is a view for explaining a roll compaction method utilized for manufacturing a susceptor according to an embodiment.
Figure 3:
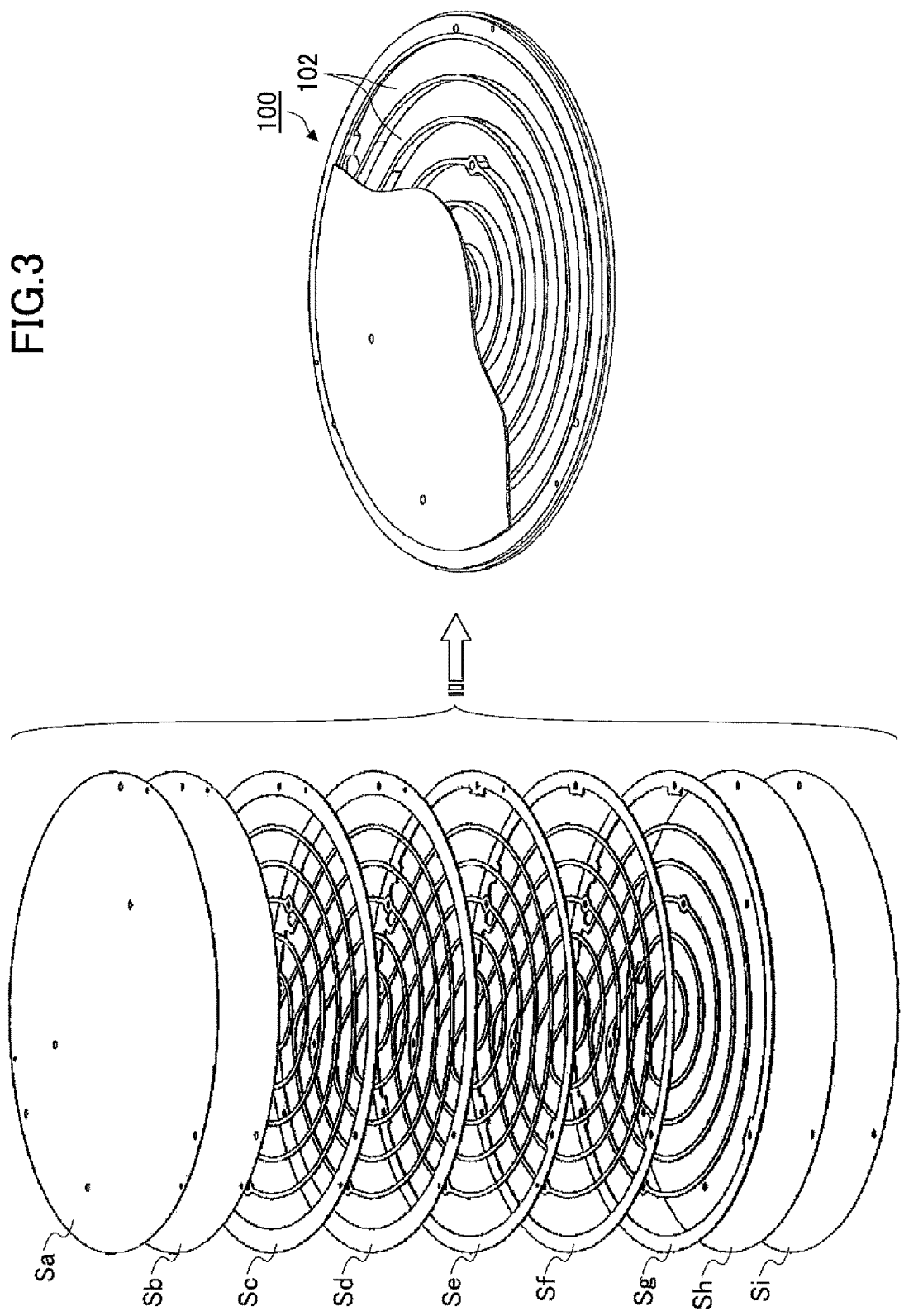
FIG. 3 is a view illustrating an example of manufacturing a susceptor according to an embodiment using the roll compaction method.

Next, a description is given below of a method of manufacturing a susceptor provided in an etching processing apparatus according to an embodiment of the present invention, with reference to FIGS. 2 and 3. FIG. 2 is a view for explaining a roll compaction (RC) method used for manufacturing a susceptor 100 of an embodiment. FIG. 3 is a view illustrating an example of manufacturing the susceptor 100 of an embodiment, using the roll compaction method.

In the roll compaction method used for manufacturing the susceptor 100 of the present embodiment, powder of silicon and carbon (C) that are materials to manufacture a base member of silicon carbide (which is hereinafter expressed as SiC) are input to a container 250 at an intended blend ratio. The container 250 produces slurry A by mixing the input materials. The slurry A is ejected in the form of a line from a feeder 260 (see B in FIG. 2) and compressed by two rotating mill rolls 270, by which a ceramics sheet of SiC is formed.

The ceramics sheet of SiC is formed into an intended shape by a laser process. For example, FIG. 3 illustrates nine ceramics sheets Sa through Si in a state of having been processed by a laser respectively. Holes to let the pins 81 pass through are formed in the ceramics sheets Sa, Sb, Sh and Si. Moreover, spiral flow passages are formed in the ceramics sheets Sc through Sg. The nine ceramics sheets Sa through Si are laminated by applying an adhesive between the respective sheets, input into a treatment furnace, and fired integrally. By doing this, the base member of the susceptor 100 of the present embodiment is formed. The base member of the susceptor 100 of the present embodiment can be fired quickly because the base member is not made of a bulk material but has a laminate structure made from thin sheet materials, by which operating time of the treatment furnace can be reduced. Furthermore, a hollow structure such as a flow passage 102 can be formed in a seamless manner due to the integration firing. With respect to the structure of the flow passage 102 and the like, various shapes can be flexibly formed by utilizing the laser process. In addition, because particles are bonded by solid phase sintering, the strength of the base member of SiC is as much as the bulk material or more.

There is an index including Young's modulus and a bending strength to show the strength of materials. Young's modulus is an amount of displacement when a certain force is applied, and is 450 PGa when the base member is made of SiC manufactured by the roll compaction method, while it is 70 GPa when the base member is made of aluminum (which is hereinafter expressed as Al).

The bending strength is a maximum bending stress caused before a crack, a breach or a fracture occurred in a test piece, and is 430 MPa when the base member is made of SiC, relative to 200 MPa when the base member is made of Al.

As discussed above, it is noted that the base member of SiC is superior to the base member of Al in mechanical strength. Accordingly, the susceptor 100 including the base member of SiC has a mechanical strength that can withstand a vacuum load in the chamber C and an inner pressure from the coolant flowing through the flow passage 102 formed inside the base member 100a.

In addition, the base member 100a used in the susceptor 100 of the present embodiment excels in temperature responsiveness. In order to improve the temperature responsiveness, it is favorable to decrease heat capacity and to increase a thermal diffusion factor (i.e., thermal conductivity of the susceptor). The heat capacitor is determined by $\rho$ (density)$\times$V (volume)$\times$Cp (specific heat) [J/K]. The thermal diffusion factor is determined by $k/(\rho \times Cp)$ [m$^2$/s].

Referring to the comparison of the physical property between the base member of SiC and the base member of Al shown in FIG. 4, the heat capacity calculated by multiplication of the weight ($=\rho \times V$) and the specific heat is 800 [J/K] in the base member of SiC, relative to 4500 [J/K] in the base member of Al.

Moreover, the thermal diffusion factor is $90 \times 10^{-6}$ [m$^2$/s] in the base member of SiC, relative to $70 \times 10^{-6}$ [m$^2$/s] in the base member of Al.

As discussed above, in the present embodiment, the base member 100a of SiC manufactured by the roll compaction method is used in the susceptor 100. This makes it possible to decrease the heat capacity of the base member 100a by reducing weight, thickness and size of the base member 100a while maintaining the mechanical strength of the base member 100a. As a result, the temperature responsiveness of the susceptor 100 can be enhanced.

[Experiment of Temperature Responsiveness]

Figure 5:
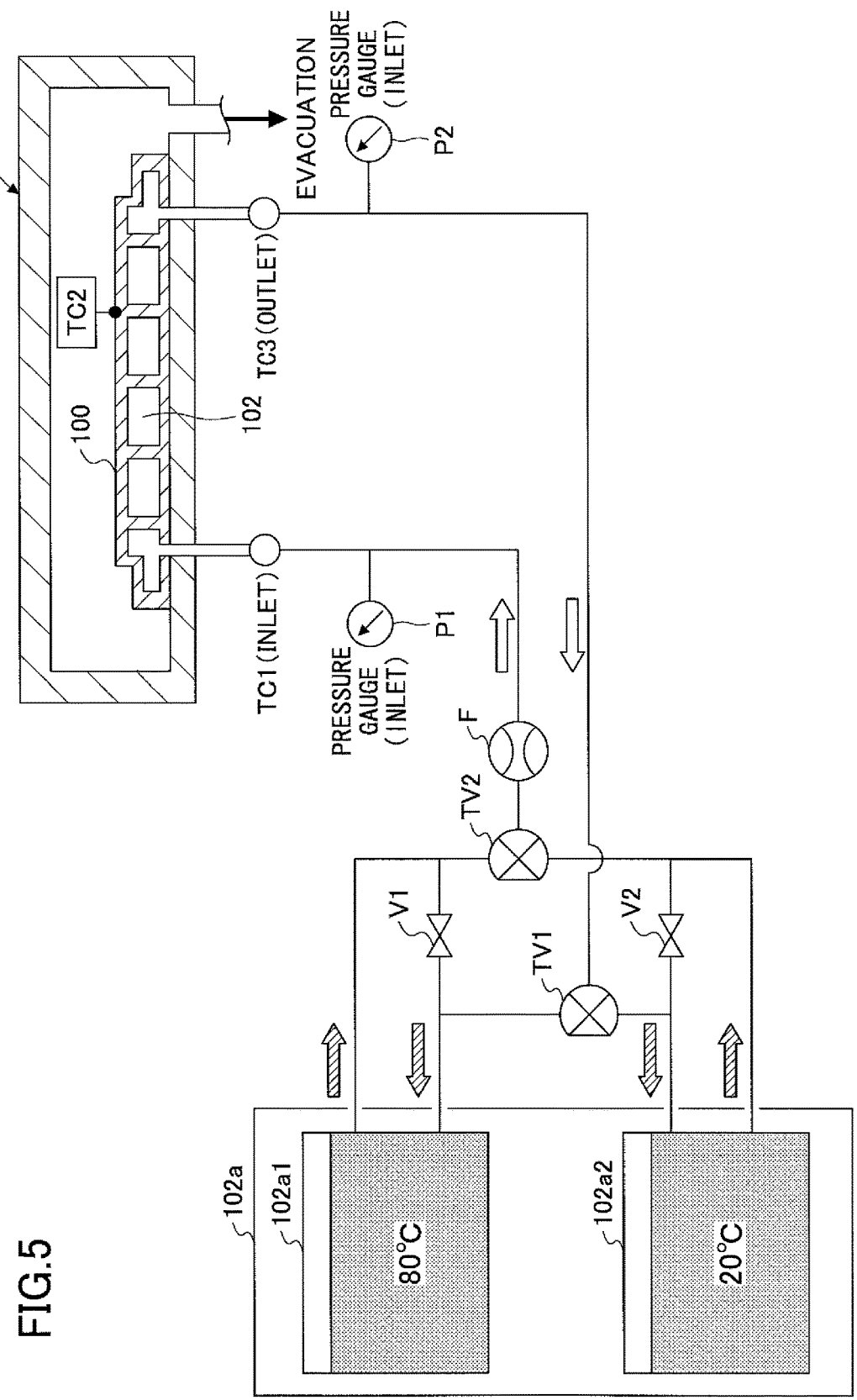
FIG. 5 is a configuration diagram of a cooling mechanism used in an experiment of temperature responsiveness of a susceptor according to an embodiment.

Next, an experiment relating to the temperature responsiveness of the susceptor is performed when the base member of SiC and the base member of Al are used. FIG. 5 is a configuration diagram of a cooling mechanism used in the experiment of the temperature responsiveness of the susceptor.

The cooling mechanism 102a switches the coolant supplied from a first container 102a1 that stores the coolant of 80° C. and a second container 102a2 that stores the coolant of 20° C., and lets the coolant flow through the flow passage 102 of the susceptor 100. The switching of the coolant supplying to the susceptor 100 is performed by switching three-way valves TV1, TV2 and valves V1, V2. A flow meter F measures a flow rate of the coolant flowing through the pipe. The susceptor 100 is placed in the chamber C of a predetermined vacuum atmosphere. Pressure gauges P1, P2 are attached to the inlet and outlet of the flow passage 102 formed in the susceptor 102. Temperature sensors TC1, TC2 and TC3 of thermocouples are respectively attached to the inlet of the flow passage 102, the upper portion of the base member of the susceptor 100 (i.e., receiving surface of the wafer W) and the outlet of the flow passage 102.

Figure 6:
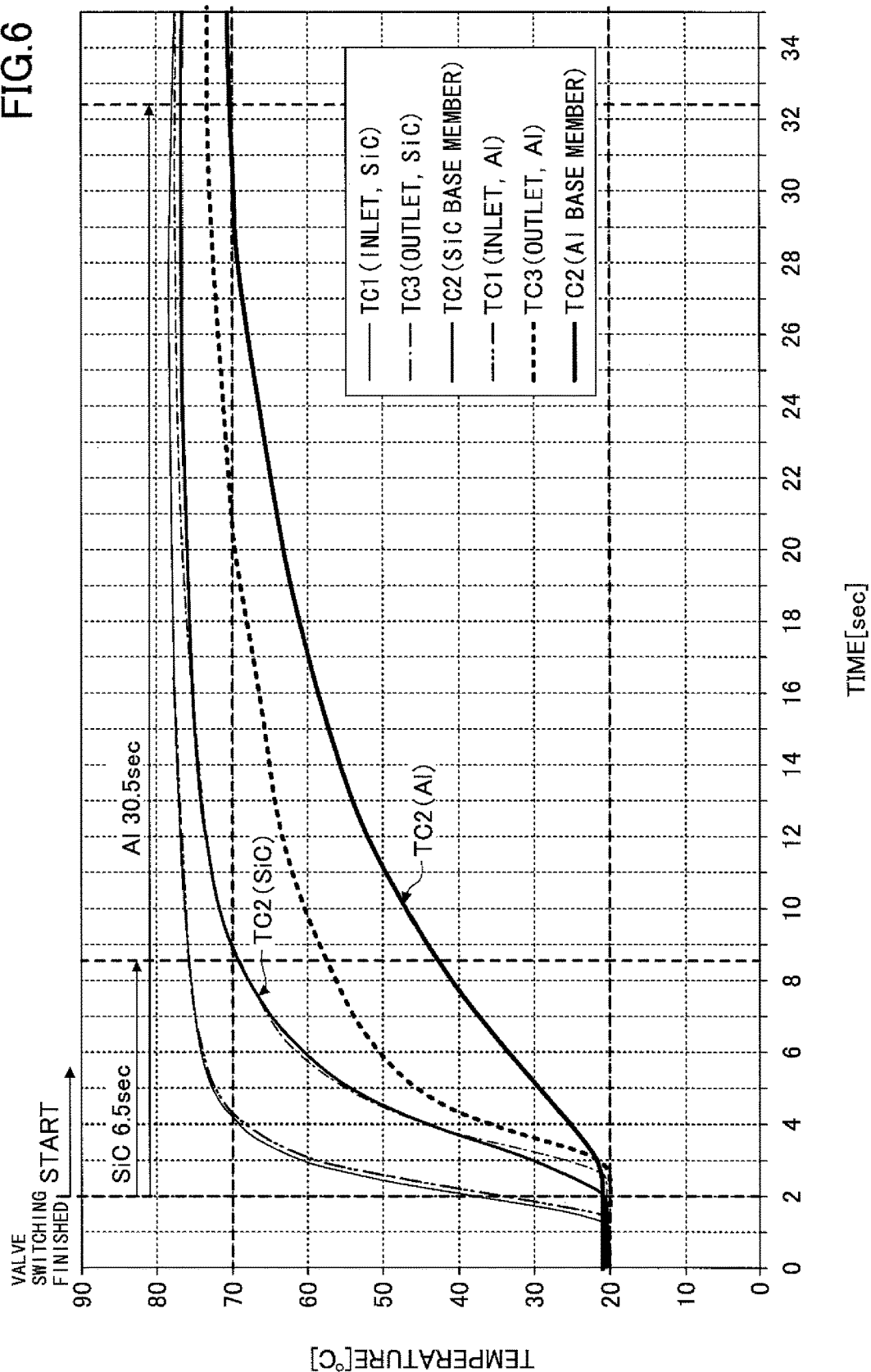
FIG. 6 is a graph illustrating an example of an experiment result of temperature responsiveness according to an embodiment.
Figure 7:
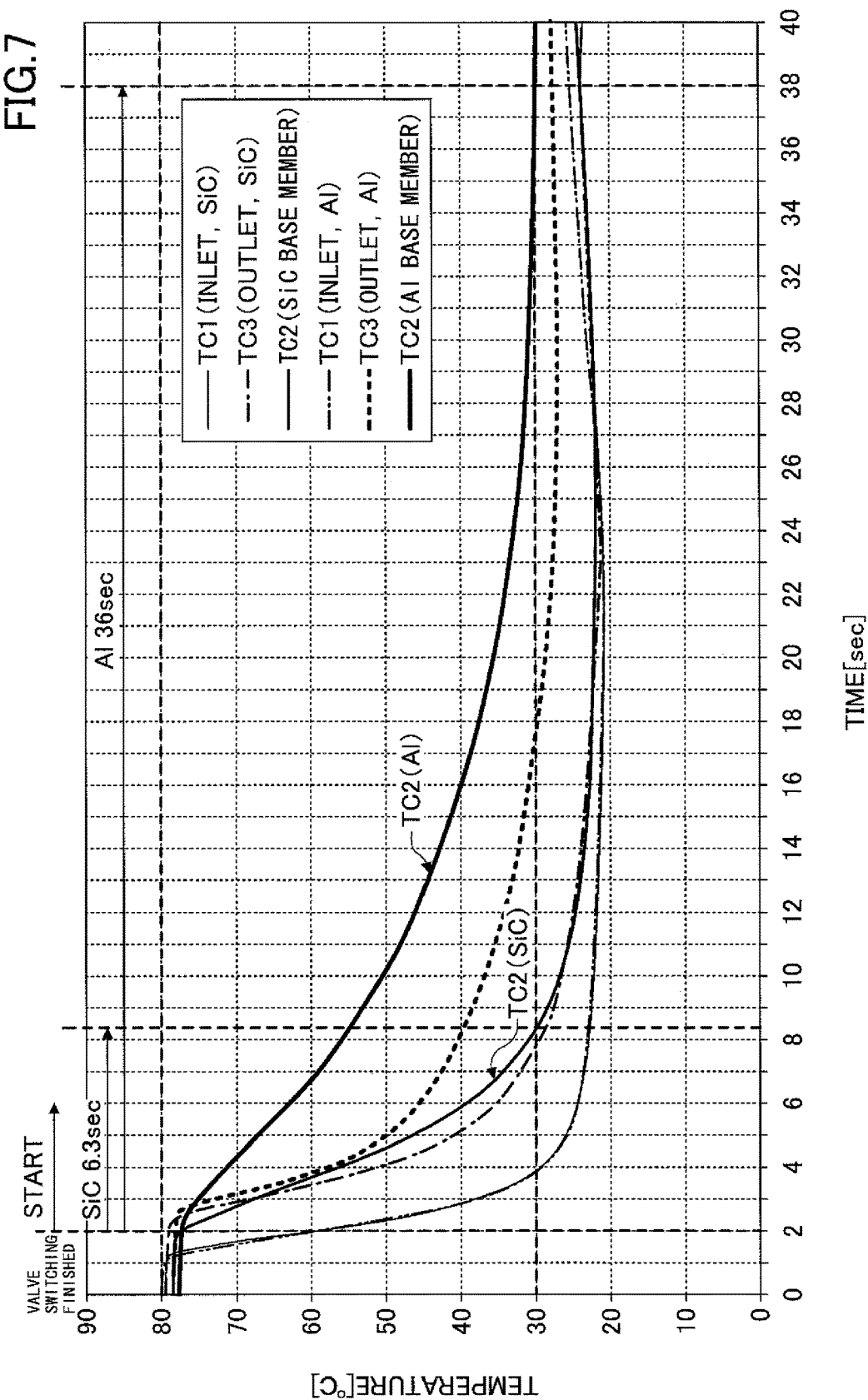
FIG. 7 is a graph illustrating another example of the experiment result of temperature responsiveness according to an embodiment.

FIG. 6 shows a result of the temperature responsiveness when the temperature of the coolant is switched from 20° C. to 80° C. in using the experimental system having the above configuration, and FIG. 7 shows a result of the temperature responsiveness when the temperature of the coolant is switched from 20° C. to 80° C.

Horizontal axes in FIGS. 6 and 7 indicate time [s], and vertical axes indicate a temperature [° C.]. To begin with, a description is given below with reference to the case of switching from the coolant of 20° C. to the coolant of 80° C. shown in FIG. 6. The first two seconds indicate time from when the three-way valves TV1, TV2 and the valves V1, V2 were switched till when the coolant of 80° C. after the switching reached the positions where the temperature sensors TC1 through TC3 were attached. Hence, the actual start time for measuring the temperature responsiveness is two seconds later from the switching of the valves and the like. Here, when the coolant was switched from 20° C. to 80° C., because the coolants of 20° C. and 80° C. intermingle with each other in the pipe, the temperature does not become 80° C. immediately. In this experiment, an attainment temperature of the base member of the susceptor 100 is set at 70° C.

The base member of the susceptor 100 of the present embodiment is made of SiC. In this case, the temperature detected by the temperature sensor TC1 of the inlet of the flow passage 102 (TC1 (INLET, SiC) in FIG. 6) firstly reaches 70° C. The time was 6.5 seconds when the temperature detected by the temperature sensor TC2 (TC2 (SiC BASE MEMBER) in FIG. 6) on the upper portion of the base member of the susceptor 100 and the temperature sensor TC3 (TC3 (OUTLET, Al) in FIG. 6) of the outlet of the flow passage 102 reached 70° C. At this time, the increase in temperature detected by the temperature sensor TC2 of SiC on the upper portion of the base member was about 7.7° C./second.

On the other hand, when the base member of the susceptor is made of Al, the temperature detected by the temperature sensor TC1 of the inlet of the flow passage 102 (TC1 (INLET, SiC) in FIG. 6) also firstly reaches 70° C. The time was 30.5 seconds when the temperature detected by the temperature sensor TC2 (TC2 (SiC BASE MEMBER) in FIG. 6) on the upper portion of the base member of the susceptor 100 and the temperature sensor TC3 (TC3 (OUTLET, Al) in FIG. 6) of the outlet of the flow passage 102 reached 70° C. At this time, the increase in temperature detected by the temperature sensor TC2 of SiC on the upper portion of the base member was about 1.64° C./second.

The above experimental result proved that the temperature responsiveness of the susceptor in increasing the temperature from 20° C. to 70° C. improved about 4.7 times as much as the case of using Al as the base member when SiC was used as the base member.

Considering the experimental result, the heat capacity of the base member made of Al is high. Accordingly, the base member of Al cannot rapidly increase and decrease the temperature thereof following the temperature change, even when the coolant is changed, and the temperature responsiveness is insufficient.

More specifically, in a case of the base member of Al, because the heat capacity of the base member of Al is high, the heat of the coolant does not immediately transfer to the base member of Al. As a result, much of the heat of the coolant reaches the outlet of the flow passage before drawn by the base member at the beginning of changing the temperature. Hence, the temperatures respectively detected by the temperature sensor TC1 at the inlet of the flow passage of the susceptor and the temperature sensor TC3 at the outlet of the flow passage become higher than the temperature detected by the temperature sensor TC2 at the upper portion of the susceptor on ahead, and the temperature detected by the temperature sensor TC2 at the upper portion of the susceptor does not increase immediately.

In contrast, in a case of the base member of SiC, because the heat capacity of the base member made of SiC is low, the heat of the coolant in the flow passage 102 of the susceptor is easy to be drawn by the base member. As a result, the temperature that the temperature sensor TC2 has detected at the upper portion of the susceptor shifts in the same way as the temperatures respectively detected by the temperature sensor TC1 at the inlet of the flow passage of the susceptor 100 and the temperature sensor TC3 at the outlet of the flow passage, and the preferable temperature responsiveness can be obtained.

The experimental result in FIG. 7 is considered similarly. When the coolant of 80° C. was switched to the coolant of 20° C., because the coolants of 80° C. and 20° C. were mixed with each other in the pipe, the temperature did not become 20° C. immediately. In this experiment, the attainment temperature of the base member of the susceptor was set at 30° C.

In a case of the susceptor 100 of the base member made of SiC, the time before the temperature detected by the temperature sensor TC2 (TC2 (SiC BASE MEMBER) in FIG. 7) at the upper portion of the base member of the susceptor reaches 30° C. was 6.3 seconds. At this time, the decrease in temperature detected by the temperature sensor TC2 at the upper portion of the susceptor 100 was about 7.9° C./second.

By contrast, when the base member of the susceptor was made of Al, the time before the temperature sensor TC2 (TC2 (Al BASE MEMBER) in FIG. 7) at the upper portion of the base member of the susceptor reached 30° C. was 36 seconds. The decrease in temperature was about 1.39° C./second.

The above experimental result proved that the temperature responsiveness in decreasing the temperature from 80° C. to 30° C. improved about 5.7 times as much as the case of the base member made of Al when SiC was used as the base member.

[Volume Ratio of Flow Passage Relative to Volume of Base Member]

Figure 8:
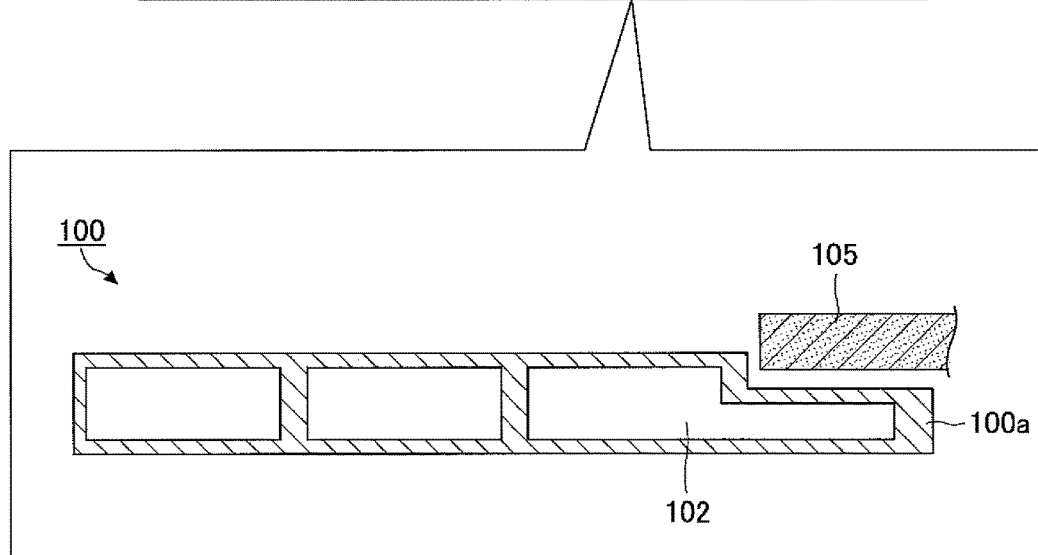
FIG. 8 is a table comparing a flow passage cubic volume of a base member made of SiC according to an embodiment with that of a base member made of Al.

Next, a description is given below of a volume ratio of the flow passage relative to a volume of the base member with reference to FIG. 8. FIG. 8 is a table comparing a volume ratio of the flow passage 102 relative to a volume of the base member of SiC of the susceptor 100 of the present embodiment with that of a case of the base member of Al.

The whole volume shown in the table is a summation of the volume of the base member and the volume of the flow passage of the base member. According to this, the whole volume when the base member 100a of SiC is used in the susceptor 100 like the present embodiment becomes about ⅓ of the whole volume when Al is used as the base member. Moreover, when the base member of SiC is used, the volume of the flow passage 102 can be more than the volume of the base member of SiC. In other words, the flow passage volume ratio relative to the whole volume is 50% or more. When the base member of SiC is used, the volume of the flow passage 102 is preferably 1 through 1.4 times as much as the volume of the base member of SiC. In other words, the flow passage volume ratio relative to the whole volume is preferably 50 through 70%.

On the other hand, because the whole volume when Al is used as the base member in the susceptor is about three times as much as the whole volume when SiC is used as the base member, it is substantially impossible to make the flow passage volume ratio 50% or more while maintaining the mechanical strength. In FIG. 8, when Al is used as the base member, the flow passage volume ratio relative to the whole volume is 25%. Here, when the base member is made of alumina ($Al_2O_3$), because the strength cannot be maintained if the thickness of the base member is made thin, it is also impossible to make the flow passage volume ratio relative to the whole volume 50% or more.

In this manner, by setting the volume ratio of the flow passage 102 relative to the whole volume in the base member 100a of SiC at 50% or more, the susceptor 100 of the present embodiment can be formed to have a structure easy to transfer the temperature of the coolant flowing through the flow passage 102 to the wafer W on the susceptor 100. This makes it possible to enhance the temperature responsiveness of the susceptor 100, to reduce the time before the susceptor 100 actually becomes the controlled temperature in response to the temperature control of the susceptor 100, and to rapidly change the temperature of the wafer W.

[Structure of Susceptor]

Figure 9:
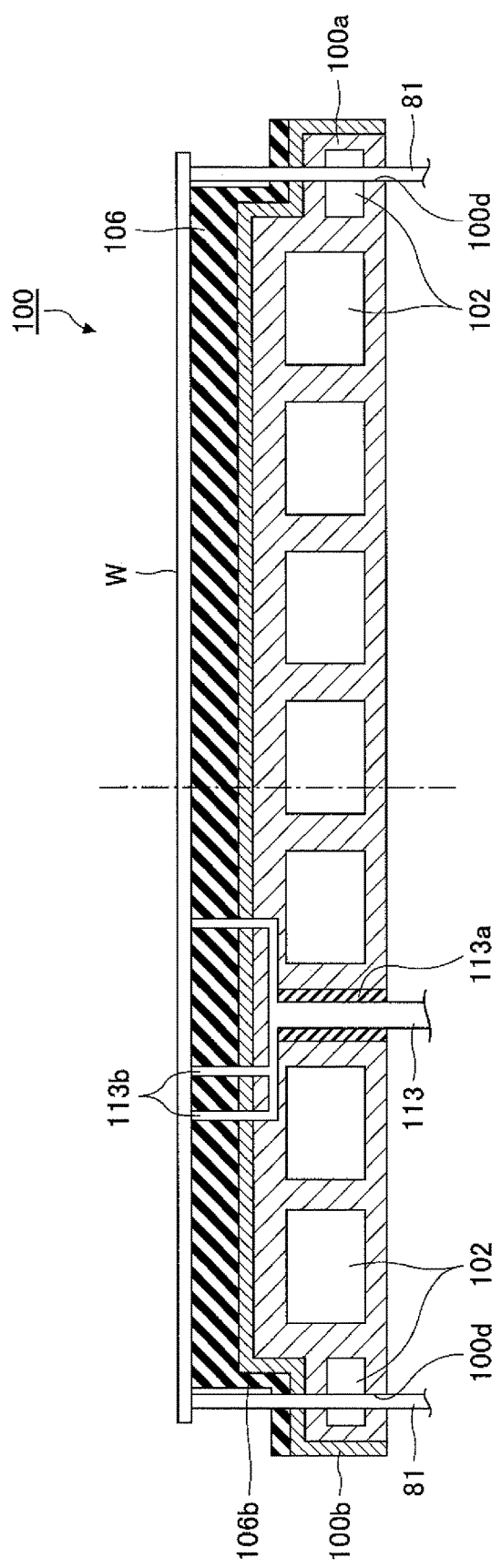
FIG. 9 is a vertical cross-sectional view of a suspector according to an embodiment.
Figure 10:
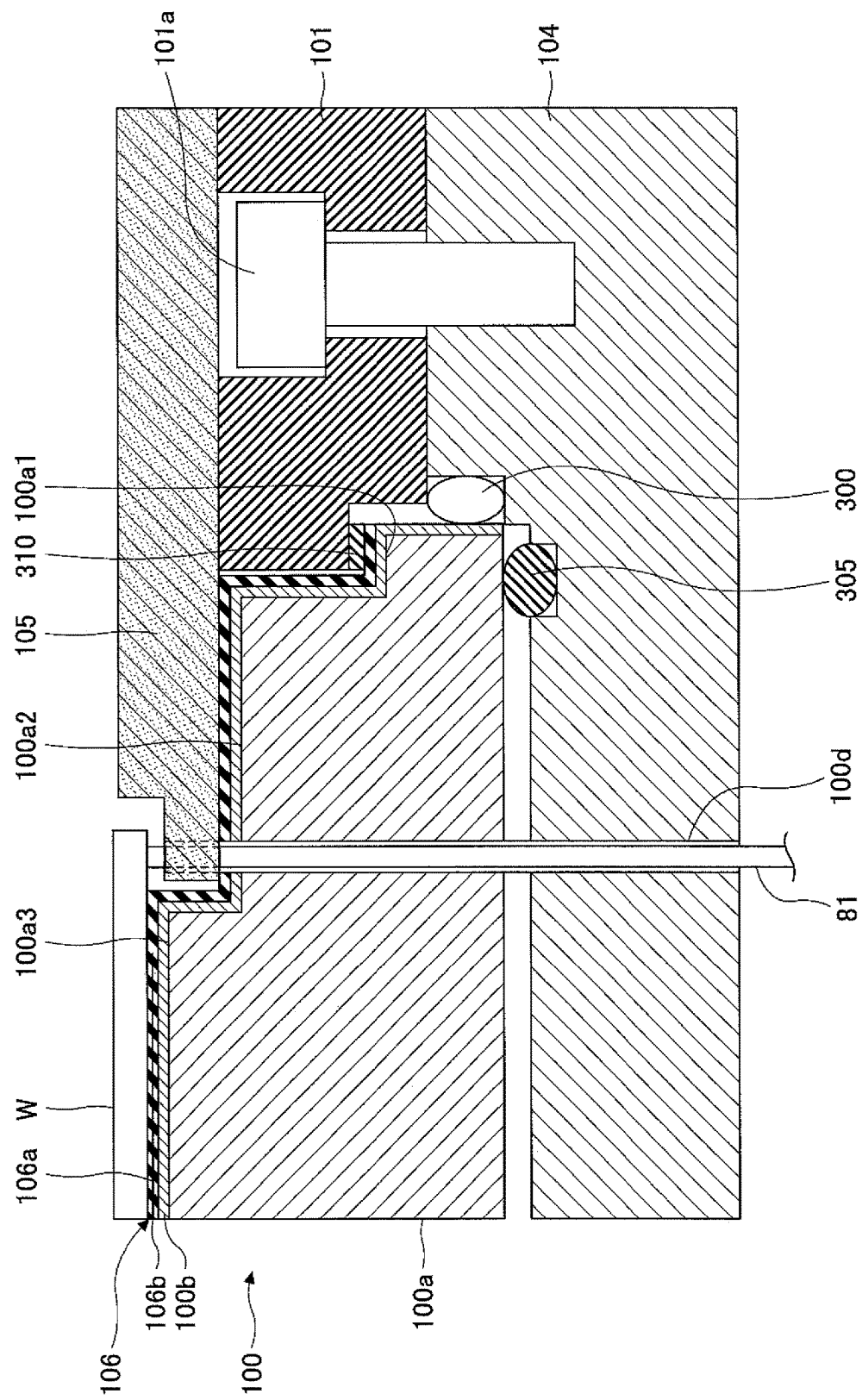
FIG. 10 is an enlarged view of an outer edge portion of a susceptor according to an embodiment.

Next, a description is given below of a structure of the susceptor 100 of the present embodiment with reference to FIGS. 9 and 10. FIG. 9 is a vertical cross-sectional view of the susceptor 100 of the present embodiment. FIG. 10 is a vertical cross-sectional view of an outer peripheral portion of the susceptor 100 of the present embodiment.

High frequency power is supplied to the susceptor 100, and the susceptor 100 functions as a lower electrode. Here, as discussed above, the base member 100a of the susceptor 100 is made of SiC. When a ceramics base member such as SiC is used in the susceptor 100, the ceramics does not conduct electricity. Therefore, in the present embodiment, by spraying Al on the base member 100a of the susceptor 100, a conductive layer 100b is formed, and the high frequency power is applied to the conductive layer 100b. More specifically, the conductive layer 100b is formed on at least the principal surface and the side surface on the side on which the wafer W is placed of the base member 100a of SiC, and is configured to become the lower electrode when the high frequency power is supplied. Here, the conductive layer 100b corresponds to a first conductive layer formed on the principal surface and the side surface on the side on which the substrate is placed of the first ceramics base member.

As illustrated in FIG. 10, two step portions are formed in the principal surface at the outer periphery of the susceptor 100 in a circumferential direction. A first step portion 100a1 is formed on the outer side, and a second step portion 100a2 is formed on the inner side. The principal surface of the base member 100a of SiC may be the whole surface of the receiving surface 100a3 of the wafer W defined by the first step portion 100a1 and the second step portion 100a2. Moreover, the side surface of the base member 100a of SiC may be a surface of a side wall defined by the first step portion 100a1 and the second step portion 100a2. Here, the first step portion 100a1 and the second step portion 100a2 are an example of a step portion provided in the periphery of the susceptor 100a.

A spiral tube 300 is provided on the side surface of the outermost periphery of the base member 100a of the susceptor 100. The spiral tube 300 is formed of a conductive material having a reactive force. The spiral tube 300 electrically connects the conductive layer 100b with the support 104 and absorbs a force from the horizontal direction.

Forming a screw hole in the ceramics base member 100a such as SiC is difficult. Accordingly, a clamp 101 that engages with the first step portion 100a1 of the susceptor 100 through a rubber member 310 is provided on the outer circumference of the susceptor 100, and a screw hole is formed in the clamp 101. The base member 100a is fixed to the support 104 by a screw 101a inserted in the screw hole through the clamp 101.

A rubber member 305 is formed of an O-ring and the like, arranged on the back surface of the base member 100a, and seals a vacuum space in the chamber C from the atmosphere. The rubber member 305 is an elastic body, formed of silicon system resin, and functions as a cushion member in fixing the base member 100a to the support 104 by absorbing a force from a vertical direction to the base member 100a.

Figure 16:
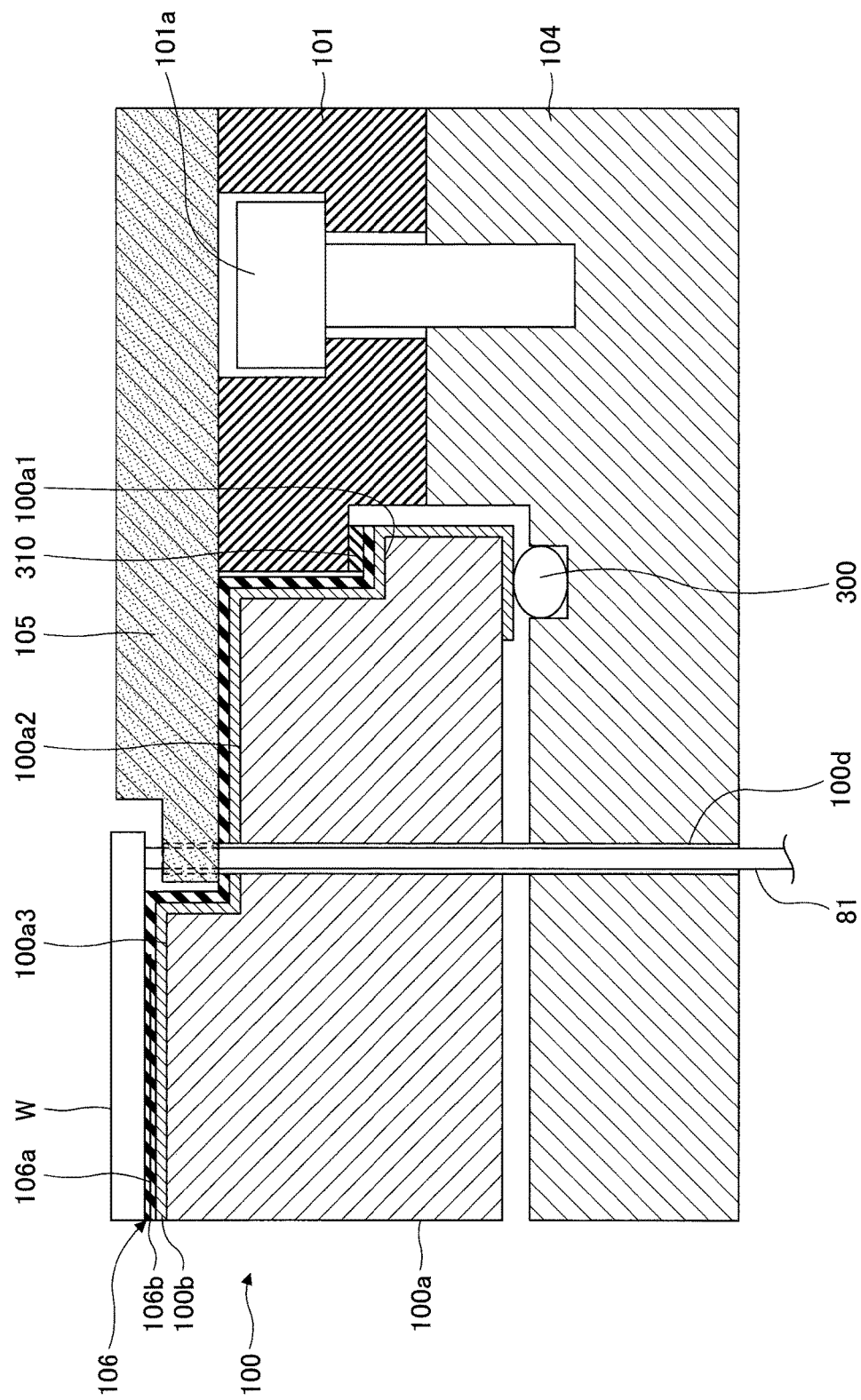
FIG. 16 is an enlarged view of an outer edge portion of a susceptor according to an embodiment.

Here, as illustrated in FIG. 16, by forming the conductive layer 100b on the back surface of the base member 100a, and by arranging the spiral tube 300 on the back surface of the base member 100a instead of the rubber member 305, the conductive layer 100b may be connected with the support 104 on the back surface of the base member 100a.

The base member 100a of SiC has low wettability. Hence, it is difficult to directly form an insulating layer of alumina on the base member 100a of SiC by thermal spray. Therefore, the conductive layer 100b is formed on the base member 100a by spraying aluminum. The conductive layer 100b may be a sprayed coating of tungsten (W).

After that, the insulating layer 106b of the electrostatic chuck 106 is formed by spraying alumina on the conductive layer 100b. Moreover, the chuck electrode 106a of the electrostatic chuck 106 is formed by spraying tungsten (W) thereon. Furthermore, by spraying alumina thereon, the electrostatic chuck 106 that sandwiches the chuck electrode 106a between the insulating layers 106b is formed. When the electrostatic chuck 106 is formed by sprayed coating, because an adhesive is not needed between the conductive layer 100b and the insulating layer 106b, the electrostatic chuck 106 is unlikely to be damaged during a waferless dry cleaning (WLDC). In addition, a thermal expansion coefficient of the insulating layer 106b of the electrostatic chuck 106 formed of the sprayed coating can be approximated to that of the base member 100a of SiC. This makes it possible to manufacture the susceptor 100 in which the electrostatic chuck 106 is unlikely to release from the base member 110a.

As illustrated by FIGS. 9 and 10, a diameter of the receiving surface 100a3 of the wafer W is smaller than that of the wafer W. Accordingly, the periphery of the wafer W placed on the receiving surface 100a3 protrudes from the receiving surface 100a3, and positions above the second step portion 100a2. Through holes 100d to let the pins 81 for supporting the wafer W pass through are formed in the base member 100a at positions that penetrate the second step portion 100a2. Cutout portions or through holes are provided in the focus ring 105.

When the wafer W is carried, the pins 81 penetrate the through holes 100d and contact the lower surface of the periphery of the wafer W. According to this structure, because the pins 81 support the periphery of the wafer W, the through holes 100d are not formed in the vicinity of the central portion of the wafer W. When there is a through-hole portion in the vicinity of the central portion of the wafer W, the temperature of the wafer W located at the through-hole portion and the surroundings thereof is not cooled but becomes high temperature (which is so-called a "hot spot"). Like the present embodiment, by arranging the pins 81 in the periphery, the generation of the hot spot can be prevented.

A path for supplying helium (He) may be formed in the ceramics sheet S illustrated in FIGS. 2 and 3. With this, as illustrated in FIG. 9, a gas supply line 113 can be formed. A sleeve 113a formed by sintering alumina is fitted in the gas supply line 113. This can prevent an abnormal discharge from occurring in the gas supply line 113. Paths 113b for supplying helium (He) connected to the gas supply line 113 are formed in the insulating layer 106b of the conductive layer 100b and the electrostatic chuck 106 in a net-like manner.

At least a part of the flow passage 102 is formed in the base member 100a in a portion overlapping the focus ring 105 when seen from a planar perspective in a stacking direction of the focus ring 105 and the base member 100a on the second step portion 100a2. This improves the heat conduction of the focus ring 105. In this manner, the susceptor 100 using the base member of SiC can be manufactured.

The following method can be provided as another method of manufacturing the susceptor 100 using the base member 100a of SiC. First, the conductive layer 100b is formed by spraying aluminum on the base member 100a of SiC, and then alumina is sprayed thereon. The insulating layer of the electrostatic chuck is not sprayed, but an insulating plate-like member is stuck on the sprayed alumina layer by an adhesive. The process of spraying alumina may be omitted when the alumina layer can be replaced by the adhesive. Moreover, alumina is sprayed on the upper surface of the insulating plate-like member. Basically, the path 113b for supplying helium (He) is formed in the plate-like member. According to the plurality of methods of manufacturing the susceptor 100 described above, the electrostatic chuck 106 is stacked on the conductive layer 100b through the sprayed coating or the adhesive layer.

[Shower Head (Upper Electrode)]

As illustrated in FIG. 1, the shower head 116 is provided at a position facing the susceptor 100 in the chamber C, and functions as an upper electrode. The shower head 116 of the present embodiment may have a configuration other than the configuration illustrated in FIG. 1, for example, a configuration similar to the susceptor 100 that also functions as a lower electrode.

Figure 11:
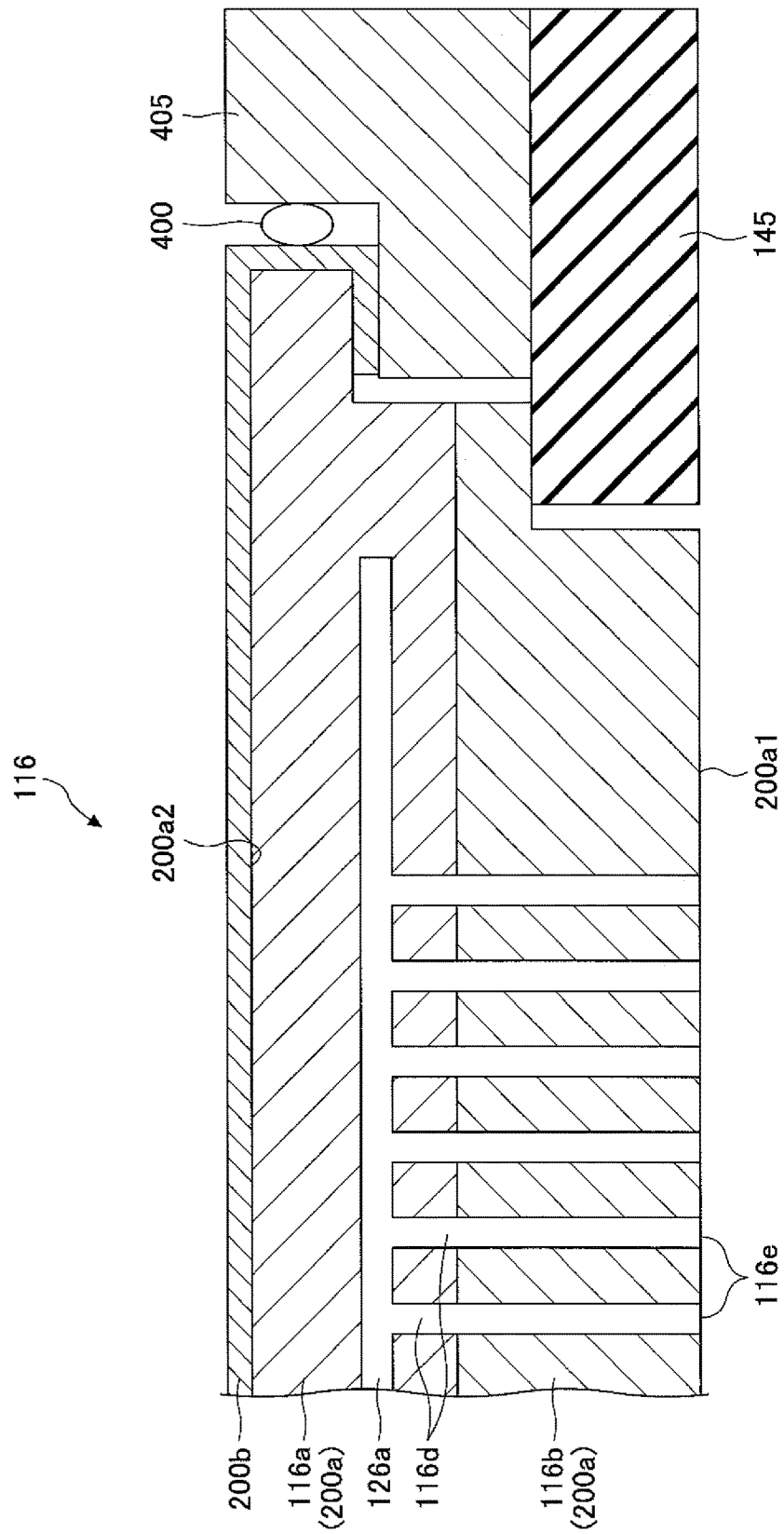
FIG. 11 is an enlarged view of an outer edge portion of an upper electrode according to an embodiment.

More specifically, as illustrated in FIG. 11, the body part 116a of the shower head 116 and an upper ceiling plate 116b may be formed of a base member 200a of SiC. In this case, the base member 200a corresponds to a second ceramics base member.

The conductive layer 200b is formed on a principal surface 200a2 (upper surface in FIG. 11) on the opposite side of a surface 200a1 (lower surface in FIG. 11) facing the susceptor 100 of the base member 200a of SiC and on a side surface. The conductive layer 200b may be a sprayed coating of aluminum or a sprayed coating of tungsten. The conductive layer 200b corresponds to a second conductive layer. The base member 200a of SiC is made of SiC whose plasma resistance property is higher than that of silicon (Si) or carbon (C), and is exposed to the plasma generation space side. Thus, the conductive layer 200b that becomes an electrode layer of the upper electrode is provided by spraying aluminum on the principal surface (back surface) 200a of the base member 200a of SiC and the side surface, but is not provided on the surface exposed to the plasma. This can prevent metal contamination.

The shower head 116 is supported by a grounded supporting member 405 that is made of aluminum. A spiral tube 400 is provided on the outermost peripheral side surface of the base member 200a of SiC. The spiral tube 400 is made of a conductive material having a reaction force. The spiral tube 400 electrically connects the conductive layer 100b with the supporting member 405 and absorbs a force from a horizontal direction to the base member 200a. With this, the conductive layer 100b functions as a conductive layer of the upper electrode.

Here, the base member 200a of SiC may be manufactured by roll compaction method as well as the base member 100a of SiC in the susceptor 100.

[Skin Depth]

The high frequency power is supplied to at least one of the conductive layer 100b of the susceptor 100 and the conductive layer 200b of the shower head 116. When the high frequency power is applied to the conductive layer 100b or the conductive layer 200b, the current passes along the surface of the conductive layer 100b or the conductive layer 200b. A phenomenon that a current concentrates more greatly to a surface of a conductive layer as a frequency of high frequency power becomes higher is called a skin effect, and a depth through which a current flows is called a skin depth.

FIG. 12 is a graph comparing a skin depth of a base member (bulk) of aluminum with that of a sprayed coating of aluminum. The horizontal axis indicates a frequency (kHz), and the vertical axis indicates a skin depth (μm). This graph shows that the skin depth of the base member of aluminum is lower than that of the sprayed coating of aluminum in the same frequency. More specifically, the graph shows that the base member of aluminum can conduct a current more efficiently than the sprayed coating of aluminum and even a thin member does not harm the property when the frequency is the same. This means that the sprayed coating does not conduct a current efficiently because a degree of purity and a degree of density of the sprayed coating are lower than those of the base member of aluminum. Accordingly, it is noted that the sprayed coating of aluminum is required to be thicker than the base member of aluminum and the electricity does not conduct efficiently when the conductive layer 100b and the conductive layer 200b are too thin.

Considering the above discussion, in the present embodiment, the thicknesses of the conductive layer 100b and the conductive layer 200b are determined based on a volume resitivity and a frequency of a high frequency power used in the etching processing apparatus 10. More specifically, it is only necessary that the thicknesses of the conductive layer 100b and the conductive layer 200b are more than the skin depth determined depending on the frequency of the high frequency power. For example, in the etching processing apparatus 10, the utilized frequency of the high frequency power is a predetermined value in a range from 400 kHz to 100 MHz. Accordingly, the thicknesses of the conductive layer 100b and the conductive layer 200b may be set at predetermined thicknesses in a range from 20 μm to 300 μm corresponding to this frequency band in FIG. 12.

Moreover, it is only necessary that the volume resitivities of the conductive layer 100b and the conductive layer 200b by sprayed coating of aluminum may be both $5 \times 10^{-5} \Omega$ or less. Furthermore, in the conductive layer 100b and the conductive layer 200b by sprayed coating of aluminum, it is only necessary to manage the thicknesses in a range from 0 to 10%. Here, the volume resitivity of the base member of aluminum is $2 \times 10^{-6} \Omega$ or less.

[Method of Thermal Spray]

Next, a description is given below of a method of thermal spray of aluminum in order to deposit the conductive layer 100b and the conductive layer 200b at predetermined thicknesses in a range from 20 μm to 300 μm with reference to FIGS. 13 and 14. Here, a description is given by citing the base member 100a of the susceptor 100, but the description can be applied to the base member 200a of the shower head 116.

Figure 13B:
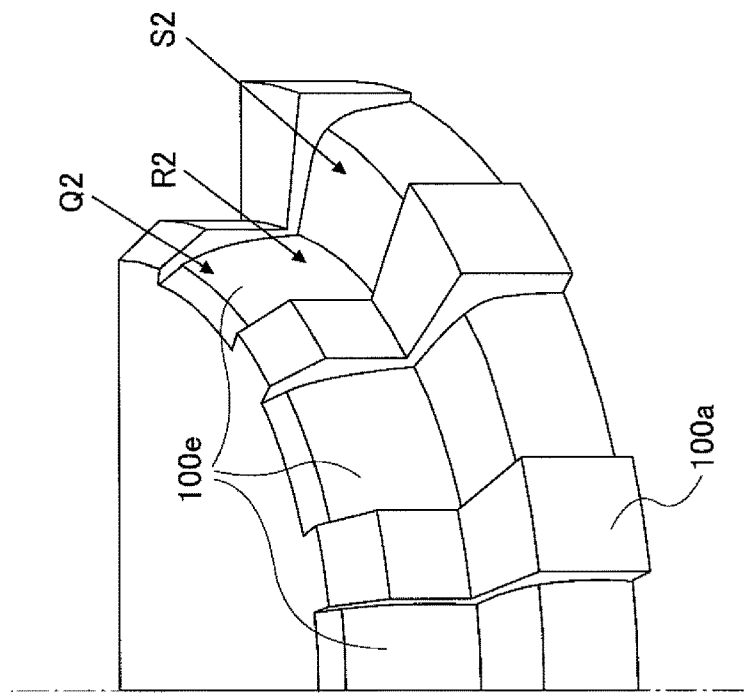
FIGS. 13A and 13B are views illustrating a groove portion provided in a base member made of SiC according to an embodiment.
Figure 13A:
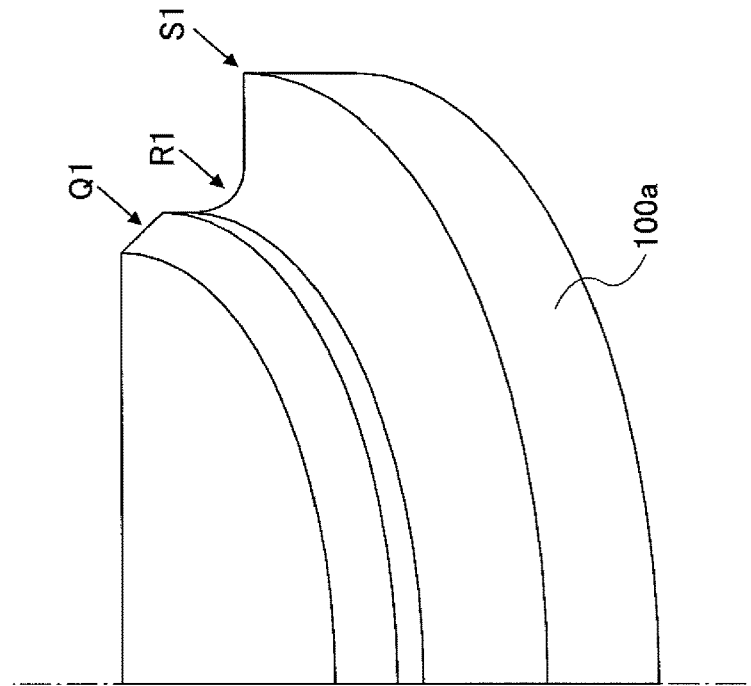

FIG. 13A is a perspective view illustrating a part of the base member 100a. FIG. 13B is a view providing a plurality of groove portions in the step portion of the base member 100a in FIG. 13A. FIG. 14A is a cross-sectional view and a plan view when a sprayed coating of aluminum is formed on the base member 100a in FIG. 13A. FIG. 14B is a cross-sectional view and a plan view when a sprayed coating of aluminum is formed on the base member 100a in FIG. 13B.

In a process of forming the sprayed coating 100b of aluminum on the base member 100a by thermal splay, as illustrated in FIG. 14A, the thickness of the sprayed coating 100b may become thin, or may become difficult to be sprayed on step portions Q1, R1 and S1 of the base member 100a. In other words, electricity does not flow efficiently at the position Q1, R1 and S1, where the coating is likely to release from the base member 100a because the coating is thin and fragile.

Therefore, in the method of thermal spray of the present embodiment, as illustrated in FIG. 13B, in the step portions Q2, R2 and S2, a plurality of groove portions 100e is regionally formed from the flat central portion of the base member 100a to the outside, and then the sprayed coating is formed by spraying aluminum. In FIG. 13B, in the step portions Q2, R2 and S2 of the periphery of the base member 100a, the plurality of groove portions is formed in a circumferential direction. The step portions Q2, R2 and S2 are planarized in regions in the groove portions 100e.

This allows the sprayed aluminum to be easily collected in the groove portions 100e at the periphery of the base member 100a. This makes it possible to ensure the thickness of 20 μm to 300 μm at least in the groove portions 100e even if the thickness of the sprayed coating 100b becomes thin in the circumferential direction at the step portions Q2, R2 and S2. This can prevent the sprayed coating 100b of aluminum from being thin in the circumferential direction as a whole at the step portions Q2, R2 and S2.

According to this structure, the groove portions 100e function as paths to let the current through the sprayed coating of aluminum. This allows the current to easily pass through the sprayed coating 100b. Moreover, the groove portions 100e have a function of preventing the sprayed coating from being released.

As discussed above, according to the method of thermal spray of the present embodiment, the sprayed coating 100b of aluminum that easily conducts the current and makes it difficult to be stripped off can be formed. According to this method, a path for a current is not required to be formed by metal processing tool, but can be formed on the surface of the base member. Here, in forming the groove portions 100e in the base member 100a, by making a special tool, the process is made easy and the cost can be reduced. Here, the step portion of the ceramics base member may include the plurality of groove portions.

[Confirmatory Experiment of Current Flow]

Finally, a description is given below of an experiment to confirm a state of a current when a wafer W of 300 mm was placed on various electrodes with reference to FIG. 15. The compared electrodes were the following three kinds of electrodes.

<Compared Electrodes>
1. An electrode of a base member (bulk) of Al
2. An electrode on which Al was sprayed on a base member of SiC
3. An electrode without sprayed Al on a bases member of SiC Moreover, process conditions of the experiment were as follows.

<Process Conditions>

| | |
|---|---|
| Pressure | 39 mTorr (4.000 Pa) |
| Kind of Gas/Gas Flow Rate | O$_2$/200 sccm |
| High Frequency Power/Power | 100 MHz (First High Frequency Power Source)/2400 W |
| High Frequency Power/Power | 13.56 MHz (Second High Frequency Power Source)/0 W |

Based on the above process conditions, in the etching processing apparatus 10 using the above electrodes of 1 through 3 as a lower electrode, an etching process was performed by using a silicon oxide film (SiO$_2$) formed on the wafer W as a film to be etched. FIG. 15 shows a result of a matching position of a variable capacitor C1 of one of two variable capacitors constituting a matching box 111a during the etching process.

Considering the result, "1. An electrode of a base member of Al" that was a standard electrode and "2. An electrode on which Al was sprayed on a base member of SiC" had similar matching positions of the matching box 111a. This indicated ways of flowing of a current that flows along the surface of the lower electrode (the susceptor 100) when seen from plasma were similar to each other. As a result, "2. An electrode on which Al was sprayed on a base member of SiC" of the present embodiment indicates that the current sufficiently flew through the lower electrode as expected as well as the standard of "1. An electrode of a base member of Al."

On the other hand, "3. An electrode without sprayed Al on a base member of SiC" differed from "1. An electrode of a base member of Al" and "2. An electrode on which Al was sprayed on a base member of SiC" in matching position and looked like a high-value resistance when seen from the plasma. This indicated that a way of flowing of the current that flew along the surface of the lower electrode was different when seen from the plasma. This result shows that "3. An electrode without sprayed Al on a base member of SiC" of the present embodiment did not conduct the current through the lower electrode efficiently.

The above experimental result has proved that forming a conductive layer by spraying aluminum is necessary or preferable when SiC is used in a base member.

As mentioned above, a description was given of a substrate processing apparatus and a susceptor in the embodiments, but the substrate processing apparatus and the susceptor of the present embodiments are not limited to the above embodiments, and various modification and improvement could be made hereto without departing from the spirit and scope of the invention.

For example, in the above embodiments, the base member of the susceptor and the shower head is formed of SiC, but the material is not limited to this as long as the base member is formed of ceramics. For example, aluminum nitride (AlN), alumina (Al$_2$O$_3$), silicon nitride (SiN) and oxidation zirconia (ZrO$_2$) may be used in the base member of the susceptor and the shower head of the present invention.

In addition, for example, in the above embodiment, the susceptor and the shower head of the present invention is applied to the etching processing apparatus. However, the susceptor and the shower head can be also applied to plasma apparatuses other than the etching processing apparatus, for example, an ashing apparatus, a film deposition apparatus and the like. On this occasion, a capacitively coupled plasma (CCP: Capacitively Coupled Plasma) generation unit, an inductively coupled plasma (ICP: Inductively Coupled Plasma) generation unit, a helicon wave plasma (HWP: Helicon Wave Plasma) generation unit, a microwave-excited surface wave plasma generation unit including microwave plasma or SPA (Slot Plane Antenna) plasma that are generated from a radial antenna, an electron cyclotron resonance plasma (ECR: Electron Cyclotron Resonance Plasma) generation unit and the like can be used as a unit to generate plasma in the plasma processing apparatus. Moreover, the susceptor of the present invention is available for a substrate processing apparatus that processes a substrate by means other than plasma.

The substrate that is processed in the present invention is not limited to the wafer W used in the description in the embodiments, but for example, may be a large substrate for a flat panel display or a substrate for EL (Electroluminescence) device or solar cell.

Furthermore, the cooling mechanism 102a of the present invention allows a fluid other than cooling water and Gulden to let through the pipes 102b as a coolant.

Thus, according to the embodiments of the present invention, temperature responsiveness of a susceptor can be improved.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A substrate processing apparatus comprising: a chamber; a susceptor to receive a substrate and provided in the chamber, the susceptor including a first ceramics base member including a flow passage to let a coolant pass through and formed therein and a first conductive layer formed on a top surface of the first ceramics base member, the top surface of the first ceramics base member is configured to receive and support the substrate, and a side surface of the first ceramics base member; a gas supply source to supply a predetermined gas into the chamber; and a high frequency power source electrically connected via a conducting member contacting the first conductive layer at an outer surface of the first ceramics base member to generate plasma.

2. The substrate processing apparatus of claim 1, wherein the first ceramics base member includes a step portion formed in a periphery thereof, and the step portion includes a plurality of groove portions in a circumferential direction.

3. The substrate processing apparatus of claim 2, wherein a thickness of the first conductive layer formed on the top surface and the plurality of groove portions is equal to or more than a skin depth determined based on a frequency of the high frequency power.

4. The substrate processing apparatus of claim 3, wherein the first conductive layer is formed into a predetermined thickness in a range of 20 through 300 μm.

5. The substrate processing apparatus of claim 4, further comprising:
an upper electrode provided at a position facing the susceptor in the chamber, the upper electrode including a second ceramics base member and a second conductive layer formed on a principal surface on an opposite side of a surface facing the susceptor and a side surface of the second ceramics base member,
wherein the high frequency power source supplies the high frequency power to the first conductive layer and the second conductive layer.

6. The substrate processing apparatus of claim 5, wherein resistances of the first conductive layer and the second conductive layer are both equal to or less than $5\times10^{-5}\Omega$.

7. The substrate processing apparatus of claim 1, wherein a first step portion is formed in a first upper surface of the first ceramics base member in a circumferential direction, and the first ceramics base member is fixed with a clamp that engages with the first step portion.

8. The substrate processing apparatus of claim 7, wherein a second step portion is formed in a second upper surface of the first ceramics base member in a circumferential direction, and a focus ring is engaged with the second step portion, and at least a part of the flow passage is formed in the first ceramics base member in a region overlapping with the focus ring when seen from a planar perspective in a stacking direction of the first ceramics base member and the focus ring.

9. The substrate processing apparatus of claim 8, wherein a diameter of the receiving surface of the susceptor defined by the second step portion in the second upper surface of the first ceramics base member is smaller than that of the substrate, and a through-hole to let a pin for supporting the substrate pass through is formed in the second step portion of the first ceramics base member.

10. The substrate processing apparatus of claim 1, wherein the first ceramics base member is formed of one of silicon carbide (SiC), aluminum nitride (AlN), alumina ($Al_2O_3$), silicon nitride (SiN) and zirconium dioxide ($ZrO_2$).

11. The substrate processing apparatus of claim 1, wherein the susceptor includes an electrostatic chuck stacked on the first conductive layer and configured to electrostatically attract a wafer received thereon.

12. The substrate processing apparatus of claim 11, wherein the electrostatic chuck is stacked on the first conductive layer through one of a sprayed layer and an adhesive layer.

13. The substrate processing apparatus of claim 1, wherein a volume of the flow passage is equal to or greater than a volume of the first ceramics base member.

14. The substrate processing apparatus of claim 13, wherein the volume of the flow passage is 1 through 1.4 times as large as the first ceramics base member.

15. The substrate processing apparatus of claim 1, wherein the high frequency power is applied, through a portion of the first conductive layer formed on the side surface, to a portion of the first conductive layer formed on the top surface.

16. The substrate processing apparatus of claim 1, wherein the susceptor is supported by a metallic support, the high frequency power source is connected to the metallic support, and the conducting member electrically connects the first conductive layer to the metallic support.

17. The substrate processing apparatus of claim 16,
wherein the conducting member is a spiral tube;
wherein the first conductive layer is formed on a back surface of the first ceramics base member; and
wherein the spiral tube is arranged on a back surface side of the first ceramics base member.

18. The substrate processing apparatus of claim 16,
wherein the conducting member is a spiral tube;
wherein the support includes a first surface opposite the side surface of the first ceramics base member; and
wherein the spiral tube is arranged between the first surface of the support and the side surface of the first ceramics base member.

19. The susceptor of claim 1, wherein the first conductive layer is configured as an electrode to which the high frequency power is supplied, and the first conductive layer is thicker than a skin depth determined based on a frequency of the high frequency power.

* * * * *